United States Patent
Geng et al.

(10) Patent No.: US 10,503,012 B2
(45) Date of Patent: Dec. 10, 2019

(54) FABRICATION METHOD AND FABRICATION APPARATUS FOR BACKLIGHT SOURCE, DISPLAY DEVICE, AND A DISPLAY SYSTEM

(71) Applicants: BOE TECHNOLOGY GROUP CO., LTD., Beijing (CN); BEIJING BOE DISPLAY TECHNOLOGY CO., LTD., Beijing (CN)

(72) Inventors: Shixin Geng, Beijing (CN); Jin Han, Beijing (CN); Tengfei Wang, Beijing (CN); Wei Zhang, Beijing (CN); Hao Zhou, Beijing (CN); Weihao Hu, Beijing (CN); Yu Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/770,632

(22) PCT Filed: Nov. 1, 2017

(86) PCT No.: PCT/CN2017/108911
§ 371 (c)(1),
(2) Date: Apr. 24, 2018

(87) PCT Pub. No.: WO2018/176834
PCT Pub. Date: Oct. 4, 2018

(65) Prior Publication Data
US 2019/0072821 A1    Mar. 7, 2019

(30) Foreign Application Priority Data
Mar. 30, 2017 (CN) .......................... 2017 1 0200377

(51) Int. Cl.
*G02F 1/1335* (2006.01)

(52) U.S. Cl.
CPC .. *G02F 1/133609* (2013.01); *G02F 1/133603* (2013.01); *G02F 1/133528* (2013.01)

(58) Field of Classification Search
None
See application file for complete search history.

(56) References Cited

U.S. PATENT DOCUMENTS 8,115,779 B2 *  2/2012  Ackermann ......... H05B 33/086
                                                      345/589
9,030,127 B2    5/2015  Chen
(Continued)

FOREIGN PATENT DOCUMENTS

| CN | 103747597 A | 4/2014 |
| CN | 103839936 A | 6/2014 |
| CN | 104907266 A | 9/2015 |

OTHER PUBLICATIONS

International Search Report dated Jan. 26, 2018, issued in counterpart International Application No. PCT/JP2017/108911. (12 pages).
(Continued)

*Primary Examiner* — Ashok Patel
(74) *Attorney, Agent, or Firm* — Westerman, Hattori, Daniels & Adrian, LLP

(57) ABSTRACT

A method for fabricating a backlight source includes determining an n-step MacAdam ellipse in a uniform chromaticity diagram, where n is an integer smaller than or equal to 3; and fabricating the backlight source according to chromaticity coordinates within the n-step MacAdam ellipse to cause chromaticity coordinates of light emitted from different ones of light-emitting diodes of the backlight source to be within the n-step MacAdam ellipse.

7 Claims, 8 Drawing Sheets

(56) References Cited

U.S. PATENT DOCUMENTS

2009/0200907 A1     8/2009   Zukauskas et al.
2015/0262979 A1*   9/2015   Yamauchi ........... H01L 25/0753
                                                                362/231

OTHER PUBLICATIONS

Office Action dated Apr. 29, 2019, issued in counterpart CN Application No. 201710200377.5, with English translation. (12 pages).

* cited by examiner

FABRICATION METHOD AND FABRICATION APPARATUS FOR BACKLIGHT SOURCE, DISPLAY DEVICE, AND A DISPLAY SYSTEM

CROSS-REFERENCE TO RELATED APPLICATION

This PCT patent application claims priority to Chinese Patent Application No. 201710200377.5, filed on Mar. 30, 2017, the entire contents of which are incorporated herein by reference.

TECHNICAL FIELD

The present disclosure generally relates to the field of display technologies and, more particularly, to a fabrication method and a fabrication apparatus for a backlight source, a display device, and a display system.

BACKGROUND

Generally, a backlight source in a display device may include a plurality of LEDs, and light emitted by the LEDs can penetrate a display panel in the display device.

In the conventional technology, light emitted from different LEDs has different luminance and chrominance. When a display device or a display system displays images, light emitted from different regions of the display device or the display system has different luminance and chrominance. Thus, an image display performance is poor.

SUMMARY

In one aspect, the present disclosure provides a method for fabricating a backlight source. The method includes determining an n-step MacAdam ellipse in a uniform chromaticity diagram, and fabricating the backlight source according to chromaticity coordinates within the n-step MacAdam ellipse. n is an integer smaller than or equal to 3, and chromaticity coordinates of light emitted from different ones of light-emitting diodes of the backlight source are within the n-step MacAdam ellipse.

Another aspect of the present disclosure provides a fabrication apparatus for a backlight source. The fabrication apparatus includes a determination device and a fabrication device. The determination device includes a processor configured to determine an n-step MacAdam ellipse in a uniform chromaticity diagram, where n is an integer smaller than or equal to 3. The fabrication device is configured to fabricate the backlight source according to chromaticity coordinates in the n-step MacAdam ellipse to cause chromaticity coordinates of light emitted from different ones of light-emitting diodes of the backlight source to be within the n-step MacAdam ellipse.

BRIEF DESCRIPTION OF THE FIGURES

The following drawings are merely examples for illustrative purposes according to various disclosed embodiments and are not intended to limit the scope of the present disclosure.

DETAILED DESCRIPTION

Exemplary embodiments of the disclosure will now be described in more detail with reference to the drawings. It is to be noted that, the following descriptions of some embodiments are presented herein for purposes of illustration and description only, and are not intended to be exhaustive or to limit the scope of the present disclosure.

The aspects and features of the present disclosure can be understood by those skilled in the art through the exemplary embodiments of the present disclosure further described in detail with reference to the accompanying drawings.

A light-emitting diode (LED) may have a high visibility and a low power consumption, and may often be used as a backlight source or a portion of a backlight source in a display device. In order to realize a large-area display, a plurality of display devices may be assembled together to form a display system including the plurality of display devices.

Figure 1:
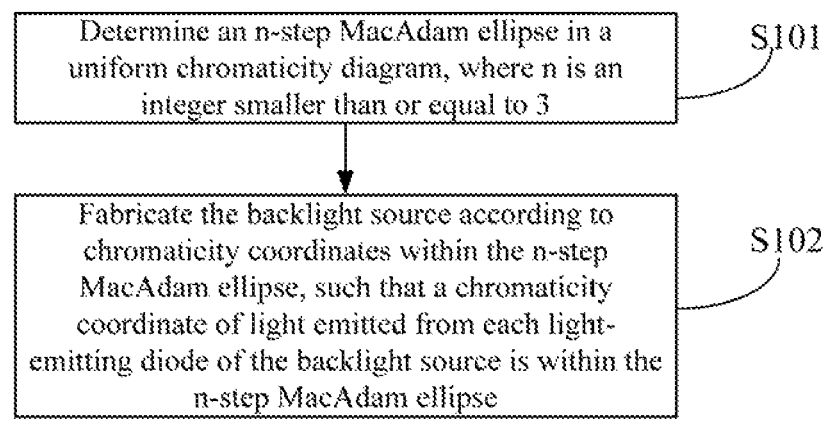
FIG. 1 illustrates a flow chart of an exemplary fabrication method for an exemplary backlight source according to various disclosed embodiments of the present disclosure.

FIG. 1 illustrates a flow chart of an exemplary fabrication method for an exemplary backlight source according to various disclosed embodiments of the present disclosure. With reference to FIG. 1, the fabrication is described below.

At S101, an n-step MacAdam ellipse is determined in a uniform chromaticity diagram, where n is an integer smaller than or equal to 3. A MacAdam ellipse is an elliptical region on a chromaticity diagram that contains colors that are indistinguishable to the average human eye, from the color at a center of the ellipse. MacAdam ellipses can be described as having "steps," which represent "standard deviations." For example, a point on a boundary of a 1-step MacAdam ellipse around a center of the ellipse represents 1 standard deviation from the center of the ellipse. A point on a boundary of an n-step MacAdam ellipse around a center of the ellipse represents n standard deviation from the center of the ellipse.

At S102, the backlight source is fabricated according to chromaticity coordinates within the n-step MacAdam ellipse, such that a chromaticity coordinate of light emitted from each light-emitting diode of the backlight source is within the n-step MacAdam ellipse.

In the disclosed fabrication method for the backlight source, the backlight source may be fabricated according to chromaticity coordinates within a MacAdam ellipse that is lower than or equal to 3-step, such that light emitted from different light-emitting diode of the backlight source may have chromaticity coordinates located within the MacAdam ellipse that is lower than or equal to 3-step. A human eye cannot distinguish light of two different chromaticity coordinates located within a same 3-step MacAdam ellipse. Thus, even if different LEDs of the backlight source emit light of different luminances and chrominances, the human eye cannot distinguish the different luminances and chrominances. Accordingly, when a display device consistent with embodiments of the disclosure displays an image, the light emitted from different regions of the display device may have luminance and chrominance that appear the same to the human eye, and a display performance of the display devices can be improved.

Figure 2:
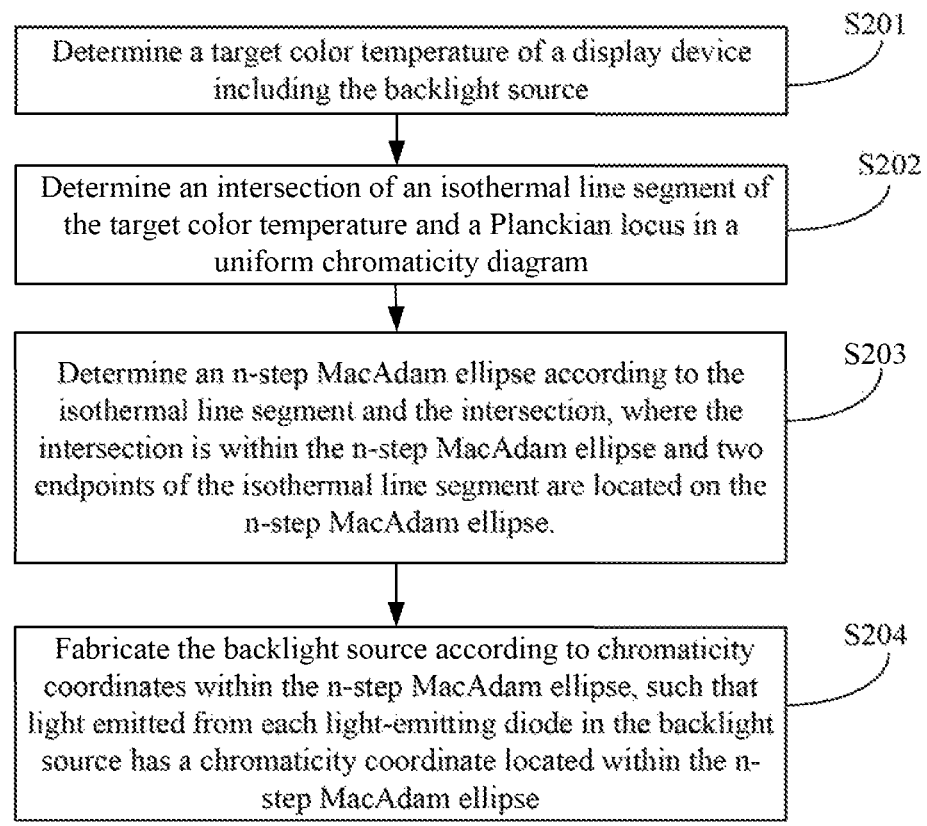
FIG. 2 illustrates a flow chart of another exemplary fabrication method for an exemplary backlight source according to various disclosed embodiments of the present disclosure.

FIG. 2 illustrates a flow chart of another exemplary fabrication method for an exemplary backlight source according to various disclosed embodiments of the present disclosure. With reference to FIG. 2, the fabrication method is described below.

At S201, a target color temperature of a display device including the backlight source is determined.

In some embodiments, each type of display device may correspond to a preset color temperature, and, at S201, the type of the display device including the backlight source to be fabricated may be determined, and then the target color temperature of the display device may be determined according to the determined type of the display device.

At S202, an intersection of an isothermal line segment of the target color temperature and a Planckian locus is determined in a uniform chromaticity diagram. A Planckian locus is a path or locus that the color of a black body may take in a chromaticity diagram as the blackbody temperature changes.

Figure 3:
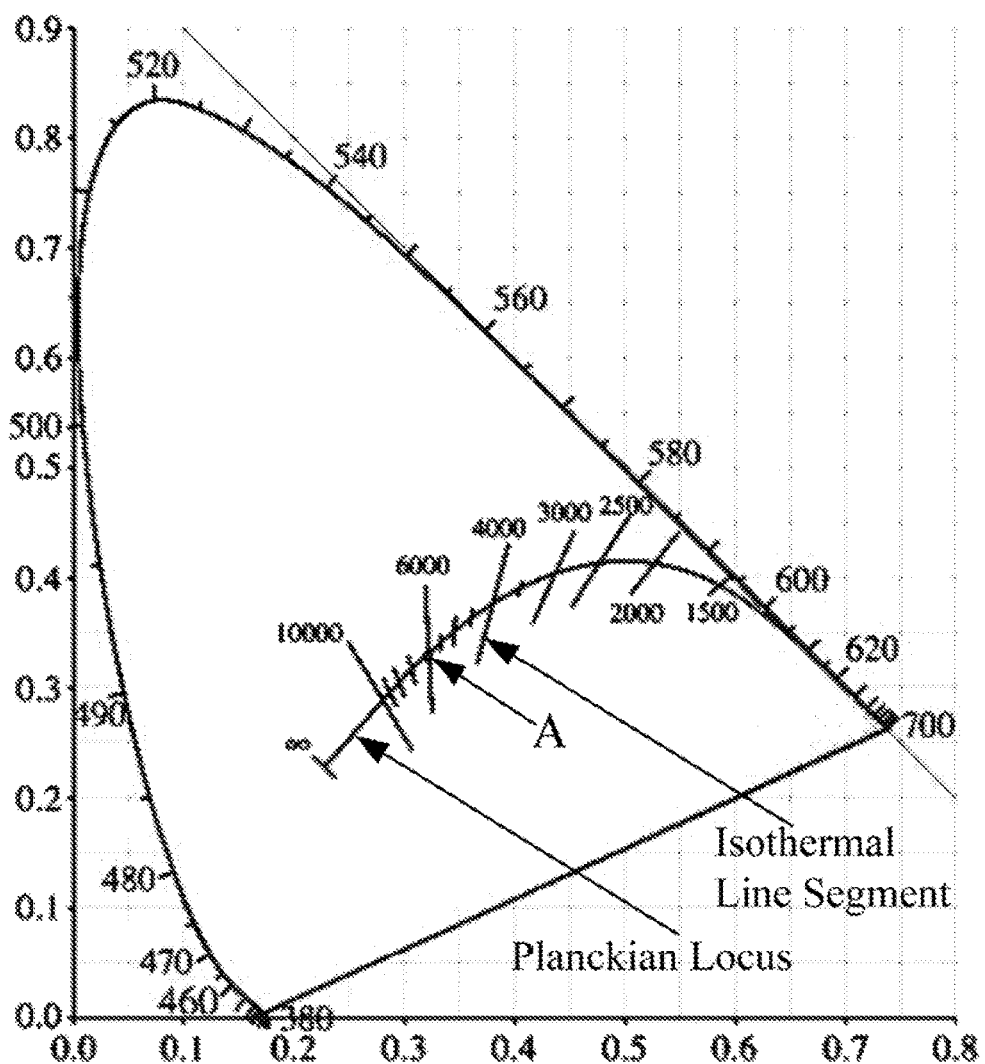
FIG. 3 illustrates a schematic view of an exemplary uniform chromaticity diagram according to various disclosed embodiments of the present disclosure.

FIG. 3 illustrates a schematic view of an exemplary uniform chromaticity diagram according to various disclosed embodiments of the present disclosure. As shown in FIG. 3, an abscissa, i.e., a lateral-coordinate and an ordinate, i.e., a vertical-coordinate, in the uniform chromaticity diagram constitute a chromaticity coordinate in the uniform chromaticity diagram. The color temperature may be related to a blackbody radiation temperature. A point in the uniform chromaticity diagram, i.e., a point corresponding to an abscissa and an ordinate, may correspond to a light color, i.e., a chromaticity. As the temperature of the blackbody rises from a lower temperature to an infinitely-high temperature, in the chromaticity diagram, the chromaticity coordinate of the blackbody chromaticity may form a continuous curve, i.e., a Planckian locus.

In addition, a plurality of isothermal line segments may exist in the uniform chromaticity diagram, and each isothermal line segment may represent a color temperature. For example, FIG. 3 illustrates isothermal line segments representing color temperatures of 1500K (1500 Kelvin), 2000K, 2500K, 3000K, 4000K, 6000K, 10000K and infinity (∞) K.

In the process of S202, the isothermal line segment corresponding to the target color temperature determined in the process of S201 can be found in the uniform chromaticity diagram, and the intersection of the isothermal line segment and the Planckian locus can be determined. For example, if the target color temperature determined in the process of S201 is 6000K, the intersection A, i.e., the chromaticity coordinate of the intersection A, of the isothermal line segment of 6000K and the Planckian locus can be determined in the process of S202.

At S203, according to the isothermal line segment and the intersection, an n-step MacAdam ellipse is determined. The intersection is within the n-step MacAdam ellipse and two endpoints of the isothermal line segment are located on the n-step MacAdam ellipse. In some embodiments, n is an integer smaller than or equal to 3.

Figure 4:
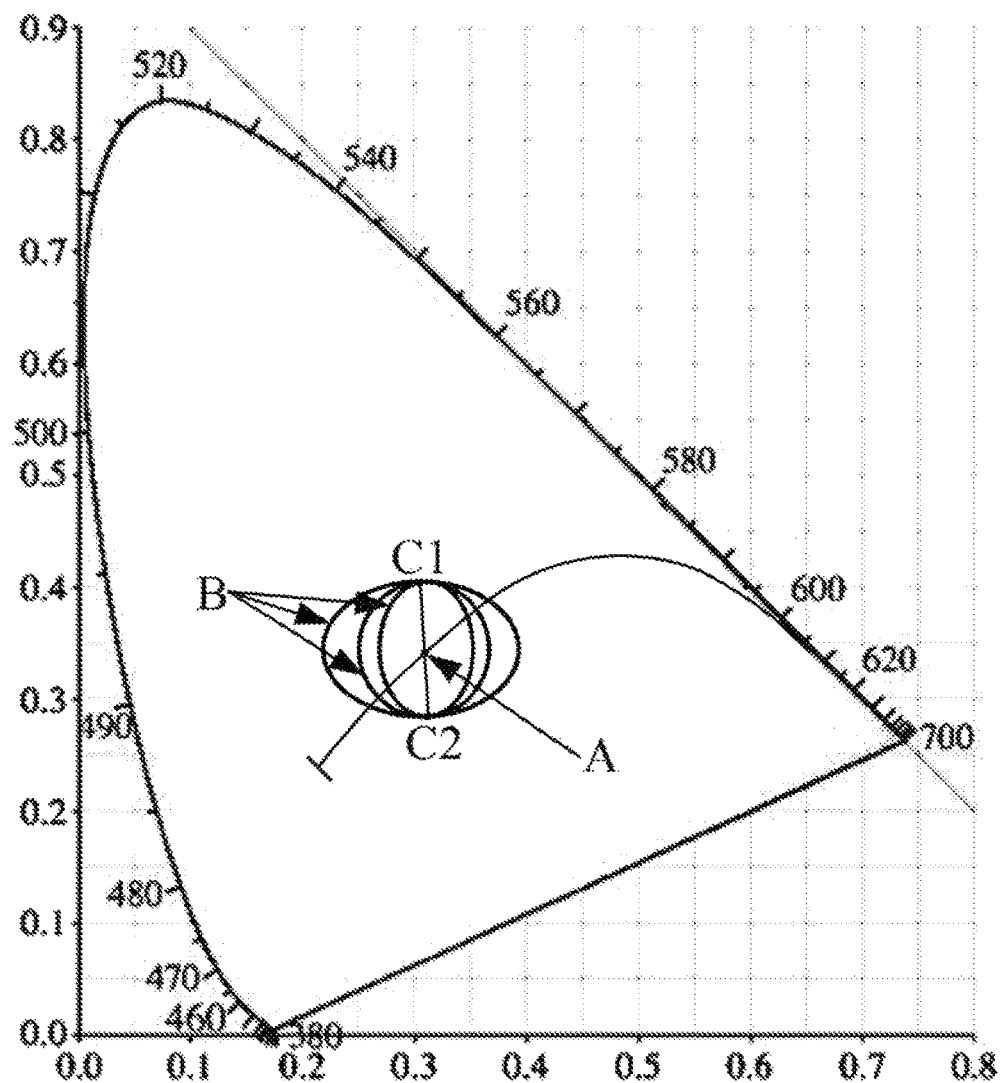
FIG. 4 illustrates schematic views of exemplary initial ellipses according to various disclosed embodiments of the present disclosure.

After the isothermal line segment of the target color temperature, and the intersection of the isothermal line segment of the target color temperature and the Planckian locus, are determined, at least one initial ellipse can be determined according to the isothermal line segment of the target color temperature and the intersection of the isothermal line segment of the target color temperature and the Planckian locus. Each initial ellipse is centered at the intersection of the isothermal line segment of the target color temperature and the Planckian locus, and the two endpoints of the isothermal line segment of the target color temperature are on the corresponding initial ellipse. For example, when the target color temperature is 6000K and the intersection of the isothermal line segment of the target color temperature and the Planckian locus is point A, a plurality of initial ellipses B can be determined, as shown in FIG. 4. Each initial ellipse has a center point at the intersection A, and the two endpoints C1 and C2 of the isothermal line segment of the target color temperature are located on each initial ellipse B.

In some embodiments, a plurality of MacAdam ellipses (not shown in FIG. 3) may exist in the uniform chromaticity diagram. After at least one initial ellipse is determined, the determined at least one initial ellipse may be matched with an m-step MacAdam ellipse in the uniform chromaticity diagram, such that a largest one of the at least one initial ellipse that contains the m-step MacAdam ellipse may be determined, where n≤m≤7. Such a largest one of the at least one initial ellipse is also referred to as a largest initial ellipse containing the m-step MacAdam ellipse. For example, assume three initial ellipses in total are determined, a first initial ellipse contains a 7-step MacAdam ellipse, a second initial ellipse contains a 5-step MacAdam ellipse, and a third initial ellipse does not contain a MacAdam ellipse that is lower than or equal to 7-step. Further, assume the first initial ellipse has a larger area than the second initial ellipse, and the second initial ellipse has a larger area than the third initial ellipse. Accordingly, it can be determined that the first initial ellipse and the second initial ellipse each is an initial ellipse containing a MacAdam ellipse lower than or equal to 7-step. Further, because the first initial ellipse is larger than the second initial ellipse, it can be determined that the first initial ellipse is a largest one of the at least one initial ellipse that contain a MacAdam ellipse lower than or equal to 7-step.

Further, after the largest initial ellipse is determined, a chromaticity-region quadrilateral can be determined according to the largest initial ellipse. Four vertices of the chromaticity-region quadrilateral can be, for example, the two endpoints of the isothermal line segment, a point on the largest initial ellipse corresponding to a minimum abscissa of the largest initial ellipse in the uniform chromaticity diagram, and a point on the largest initial ellipse corresponding to a maximum abscissa of the largest initial ellipse in the uniform chromaticity diagram, respectively. Then, the n-step MacAdam ellipse is determined in the chromaticity-region quadrilateral. In some embodiments, n may be an integer smaller than or equal to 3. If n is equal to 3, the n-step MacAdam ellipse may have a span less than or equal to approximately 0.01 in the lateral-axis direction of the uniform chromaticity diagram, and may have a span less than or equal to approximately 0.00978 in the vertical-axis direction of the uniform chromaticity diagram.

Figure 5:
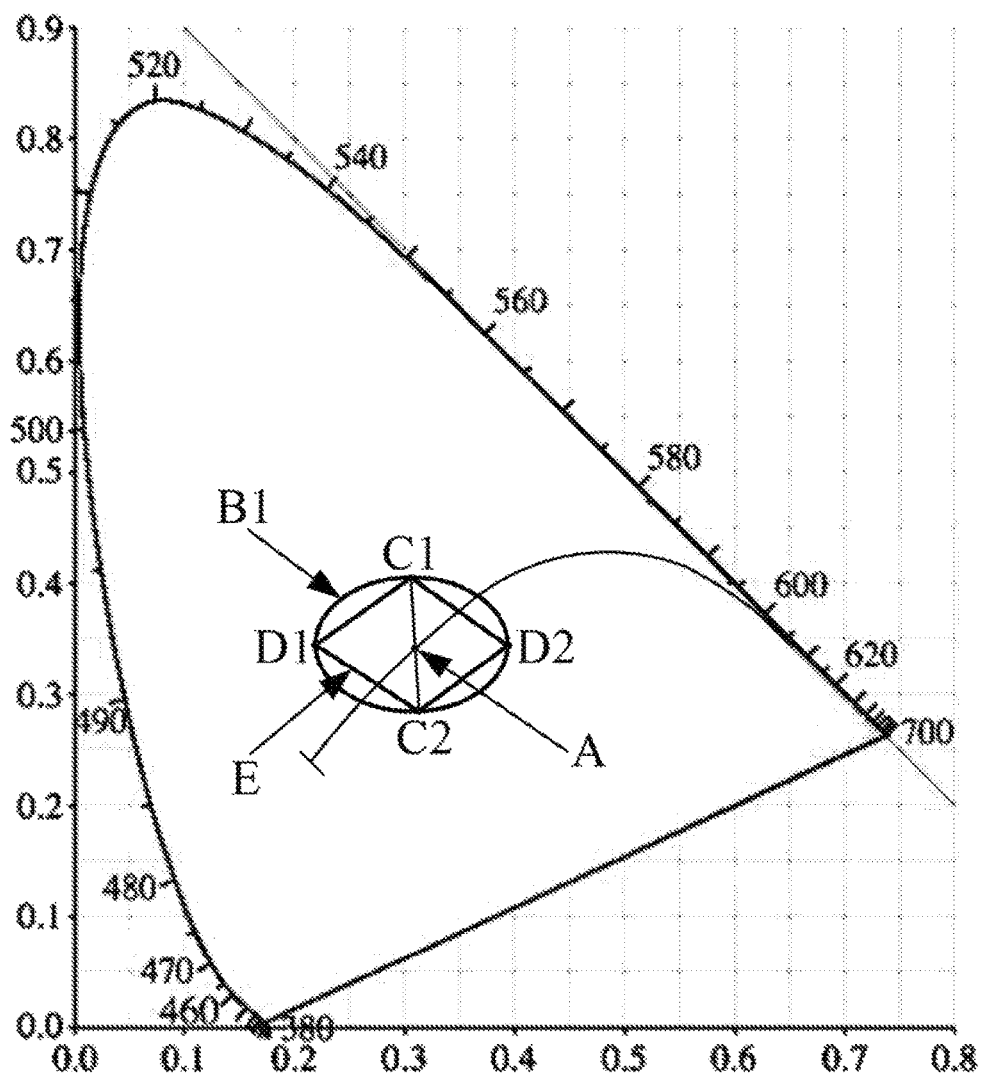
FIG. 5 illustrates a schematic view of an exemplary chromaticity-region quadrilateral according to various disclosed embodiments of the present disclosure.

For example, as shown in FIG. 5, assuming that point D1 is the point on the largest initial ellipse B1 corresponding to a minimum abscissa of the largest initial ellipse B1 in the uniform chromaticity diagram, point D2 is the point on the largest initial ellipse B1 corresponding to a maximum abscissa of the largest initial ellipse B1 in the uniform chromaticity diagram, and point C1 and point C2 are the two endpoints of the isothermal line segment of the target color temperature, then quadrilateral E can be the chromaticity-region quadrilateral.

Figure 6:
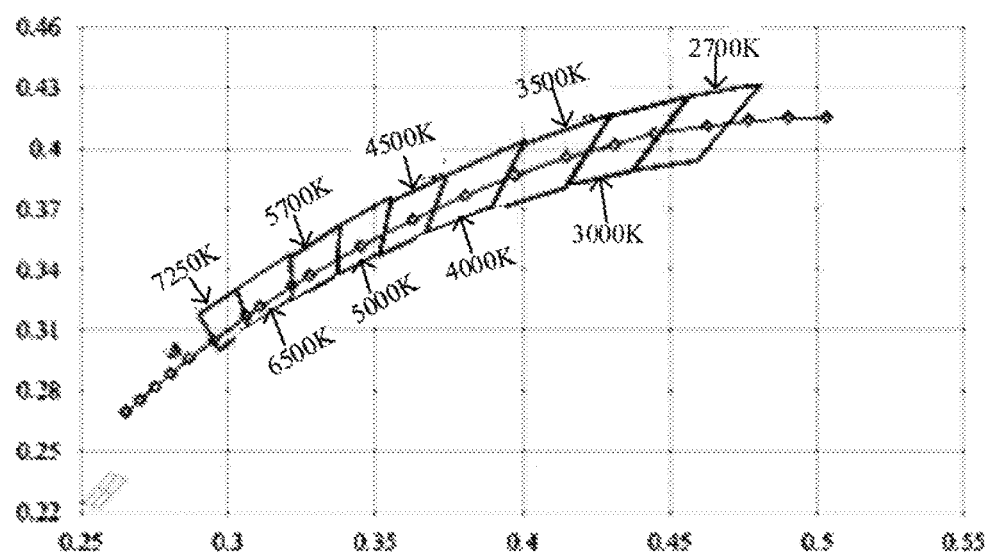
FIG. 6 illustrates schematic views of exemplary chromaticity-region quadrilaterals according to various disclosed embodiments of the present disclosure.

Similarly, for target temperatures of 7250K, 6500K, 5700K, 5000K, 4500K, 4000K, 3500K, 3000K, and 2700K, the identified chromaticity-region quadrilaterals are shown in FIG. 6, respectively.

At S204, the backlight source is fabricated according to chromaticity coordinates within the n-step MacAdam ellipse, such that light emitted from each light-emitting diode in the backlight source has a chromaticity coordinate located within the n-step MacAdam ellipse.

After the n-step MacAdam ellipse is determined in the chromaticity-region quadrilateral, the backlight source can be fabricated according to the chromaticity coordinates within the n-step MacAdam ellipse. That is, a point within the n-step MacAdam ellipse may be selected, and a light-emitting diode in the backlight source may be fabricated according to a chromaticity coordinate of the selected point, such that a chromaticity coordinate of light emitted from the light-emitting diode may be same as or close to the chromaticity coordinate of the selected point.

In some embodiments, the backlight source may include a plurality of light-emitting diodes. The plurality of light-emitting diodes may include at least two light-emitting diodes that emit white light of different wavelengths, and further the at least two light-emitting diodes may have different red light components, different green light components, and different blue light components in the white light. That is, when the at least two light-emitting diodes are fabricated, at least two different points within the n-step MacAdam ellipse may be selected, and the at least two light-emitting diodes may be fabricated according to chromaticity coordinates of the at least two different points, respectively.

In some embodiments, light emitted from the backlight source may be a sum of red light, green light, and blue light emitted from the backlight source. Further, the red light emitted from the backlight source may include red light component of white light emitted from each light-emitting diode. The green light emitted from the backlight source may include green light component of white light emitted from each light-emitting diode. The blue light emitted from the backlight source may include blue light component of white light emitted from each light-emitting diode. That is, light emitted from the plurality of light-emitting diodes in the backlight source is coupled to form coupled light. Thus, as long as the coupled light has a color satisfies a preset condition, it is not necessary for the light from each individual light-emitting diode to satisfy the preset condition. In other words, as long as the coupled light has a color that is needed, the light from each individual light-emitting diode does not have to be the color that is needed.

Further, in order to improve a uniformity of the light emitted from the backlight source, each two neighboring light-emitting diodes in the at least two light-emitting diodes may be configured to emit white light of different wavelengths. For example, the at least two light-emitting diodes may include at least one first light-emitting diode and at least one second light-emitting diode. The at least two light-emitting diodes may be arranged, for example, in the order of a first light-emitting diode, a second light-emitting diode, a first light-emitting diode, a second light-emitting diode, and so on. Further, wavelengths of white light emitted from each two neighboring light-emitting diodes in the at least two light-emitting diodes may be different.

Because a chromaticity coordinate of white light perceived by a human eye may be located below the Planckian locus, among a plurality of chromaticity coordinates of white light emitted from the plurality of light-emitting diodes, relatively more chromaticity coordinates may be configured to be below the Planckian locus than above the Planckian locus. That is, assuming, among the plurality of chromaticity coordinates of white light emitted from the plurality of light-emitting diodes in the uniform chromaticity diagram, the number of chromaticity coordinates located on a side of the Planckian locus near to the lateral axis of the uniform chromaticity diagram is referred to as x, and the number of chromaticity coordinates located on another side of the Planckian locus farther away from the lateral axis of the uniform chromaticity diagram is referred to as y, then x may be greater than y.

In addition, the isothermal line segment of the target color temperature corresponding to the display device including the backlight source may pass through the n-step MacAdam ellipse. Thus, color temperatures of chromaticity coordinates in the n-step MacAdam ellipse may be same as or close to the target color temperature. Accordingly, color temperatures of light emitted by the fabricated backlight source may be the same as or close to the target color temperature.

Figure 7:
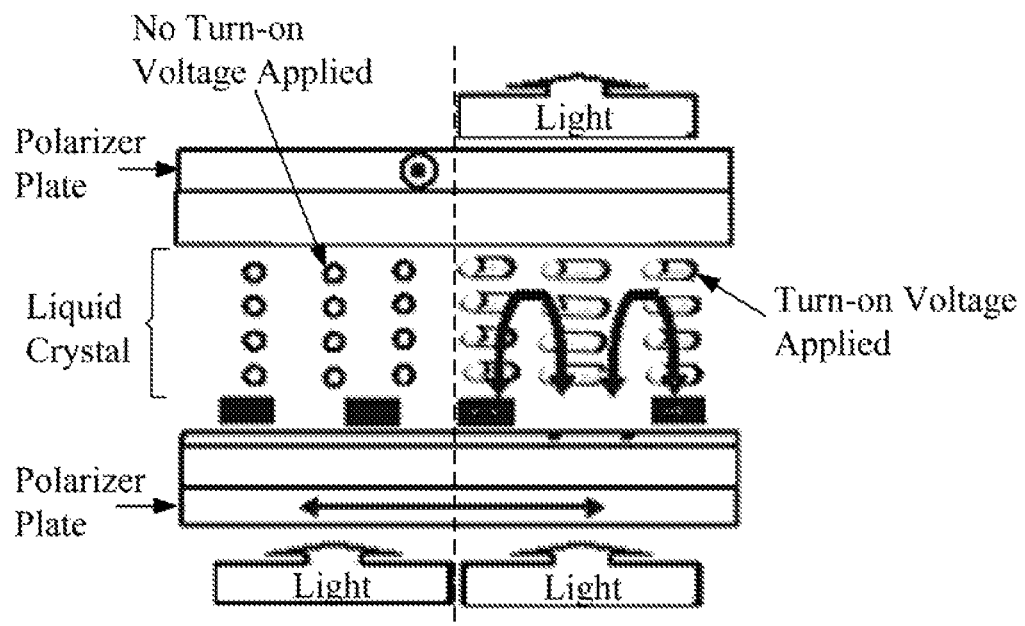
FIG. 7 illustrates a schematic view of a display panel of an advanced super dimension switch (ADS) mode.

FIG. 7 illustrates a schematic view of a display panel of an advanced super dimension switch (ADS) mode. As shown in FIG. 7, when a turn-on voltage is not applied at two ends of a liquid crystal, a polarizer plate may have a transmission axis parallel to an orientation of the liquid crystal, and incident light may be blocked by the crossed polarizer plate. Accordingly, the display panel is in a normally-black mode. When a transverse electric field is formed between the electrodes, e.g., when a turn-on voltage is applied at two ends of the liquid crystal, the liquid crystal may twist along a direction of the electric field, such that the light can pass through the crossed polarizer plates, to achieve a display function of the display panel. When the display panel displays, light may be influenced by optical anisotropy of the liquid crystal, and birefringent dispersion may occur during light transmission in the liquid crystal, thereby influencing luminance and chrominance of light emitted from the display panel.

Table 1 shows parameters of two display panels (display panel 1 and display panel 2) having same color film substrates.

TABLE 1

| Parameter | Display Panel 1 | Display Panel 2 | Difference |
|---|---|---|---|
| Wx | 0.275 | 0.28 | −0.005 |
| Wy | 0.281 | 0.288 | −0.007 |
| Rx | 0.632 | 0.633 | −0.001 |
| Ry | 0.346 | 0.346 | 0 |
| Gx | 0298 | 0.298 | 0 |
| Gy | 0.634 | 0.634 | 0 |
| Bx | 0.15 | 0.149 | 0.001 |
| By | 0.058 | 0.06 | −0.002 |
| Luminance (nit) | 558 | 555 | 3 |
| Color Temperature (K) | 10992 | 9982 | 1009 |
| Color Gamut | 74.3 | 74.3 | 0 |

As shown in Table 1, parameters of a display panel include a white-dot chromaticity coordinate (Wx, Wy) at the 255 grayscale value, a luminance, a color temperature, a color gamut, and chromaticity coordinates of red color (Rx, Ry), green color (Gx, Gy), and blue color (Bx, By) determined according to a display status of the display panel. According to Table 1, the birefringence dispersion of the liquid crystal has a relatively large influence on the color temperature. However, in the display device including the backlight source fabricated by the fabrication method of the present disclosure, color of light emitted from different light-emitting diodes of the backlight source may be located within the n-step MacAdam ellipse, and a human eye cannot distinguish a difference between chromaticity coordinates within the n-step MacAdam ellipse. Thus, even if the liquid crystal in the display panel causes an influence on the light due to the birefringence dispersion, the human eye cannot distinguish the difference in the light emitted from the two display devices caused by the influence of the birefringence dispersion.

In some embodiments, the backlight source fabricated by the fabrication method of the present disclosure can be applicable to a single display device. In some other embodiments, the backlight source fabricated by the fabrication method of the present disclosure can includes a plurality of backlight sub-sources, each backlight sub-source can be applicable to a single display device, and the plurality of backlight sub-sources, i.e., the backlight source can be applicable to a plurality of display devices that can be assembled into a display system. Accordingly, a display system having a relatively large area can be formed by assembling a plurality of display devices. Experimental results show that, for backlight sources of the two display systems, a difference in color temperatures can be controlled within approximately 500K, a chromaticity difference can be controlled within approximately 0.008, a luminance difference at 0-grayscale can be controlled within approximately 70%, and a luminance difference at 255-grayscale can be controlled within approximately 95%.

Further, before the backlight source is fabricated, a virtual model of the plurality of light-emitting diodes in the backlight source may be built, and each light-emitting diode in the built virtual model can be configured to emit light of preset luminance and a preset chromaticity coordinate. The chromaticity coordinate may be determined within the n-step MacAdam ellipse, and the determined chromaticity coordinate within the n-step MacAdam ellipse may have a boundary-point floating range that allows an error of approximately ±0.0045. Further, a voltage applied to the light-emitting diode may be controlled when the light-emitting diode emits light, such that light emitted by the plurality of light emitting-diodes can be coupled to form the needed light. Chromaticity coordinates of light emitted from the light-emitting diodes of the fabricated backlight source and chromaticity coordinates of light emitted from the light-emitting diodes of the virtual model may differ by approximately ±0.002. Peaks of light emitted from the light-emitting diodes of the fabricated backlight source may differ from peaks of light emitted from the light-emitting diodes of the virtual model by less than approximately 4 nm. Luminance of light emitted from the light-emitting diodes of the fabricated backlight source may differ from luminance of light emitted from the light-emitting diodes of the virtual model by approximately ±5%. Voltages needed to control the light-emitting diodes of the fabricated backlight source to emit light may be different from voltages needed to control the light-emitting diodes of the virtual model by approximately ±0.05 volts.

A concentration of a fluorescent powder needed for fabricating the light-emitting diodes can be determined by experiments. That is, each time, after the light-emitting diodes are fabricated, the concentration of the fluorescent powder used for fabricating the light-emitting diodes can be recorded. The concentrations of the fluorescent powder used for fabricating the light-emitting diodes at different times can be compared with each other, and a suitable concentration of the fluorescent powder can be selected.

After the light-emitting diodes are fabricated, the light-emitting diodes can be tested to determine whether the light-emitting diodes meet a preset condition. That is, the light-emitting diodes can be tested to determine whether chromaticity coordinates of the light emitted by the light-emitting diodes are located within the n-step MacAdam ellipse. Further, the light-emitting diodes can be tested to determine whether luminance of light from the fabricated backlight source meets a preset condition. If the light-emitting diodes do not meet the preset condition, various parameters for fabricating the light-emitting diodes may be adjusted. The light-emitting diodes may be fabricated again according to the adjusted parameters, until the backlight source, i.e., the light-emitting diodes, meets the preset condition.

In the disclosed fabrication method for the backlight source, the backlight source may be fabricated according to chromaticity coordinates within a MacAdam ellipse that is lower than or equal to 3-step, such that light emitted from different light-emitting diodes of the backlight source may have chromaticity coordinates located within the MacAdam ellipse that is lower than or equal to 3-step. The human eye cannot distinguish light of two different chromaticity coordinates located within a same 3-step MacAdam ellipse. Thus, even if different LEDs in the backlight source emit light of different luminance and chrominance, the human eye cannot distinguish the difference. Accordingly, when the display device displays an image, light emitted from different regions of the display device may have luminance and chrominance that appear the same to the human eye, and a display performance of the display devices may be improved.

Figure 8:
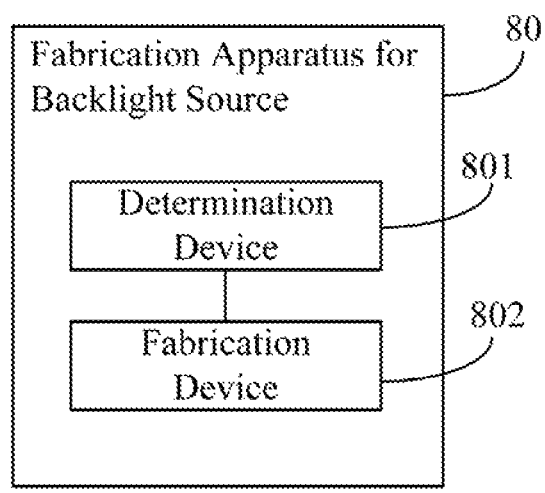
FIG. 8 illustrates a block diagram of an exemplary fabrication apparatus for fabricating an exemplary backlight source according to various disclosed embodiments of the present disclosure.

FIG. 8 illustrates a block diagram of an exemplary fabrication apparatus for fabricating an exemplary backlight source according to various disclosed embodiments of the present disclosure. As shown in FIG. 8, the fabrication apparatus 80 for fabricating the backlight source includes a determination device 801 and a fabrication device 802.

The determination device 801 is configured to determine an n-step MacAdam ellipse in a uniform chromaticity diagram, where n is an integer smaller than or equal to 3.

The fabrication device 802 is configured to fabricate the backlight source according to chromaticity coordinates within the determined n-step MacAdam ellipse, such that chromaticity coordinates of light emitted from different light-emitting diodes of the backlight source are located within the n-step MacAdam ellipse.

In the fabrication apparatus of the present disclosure for fabricating a backlight source, a fabrication device may fabricate the backlight source according to chromaticity coordinates within an MacAdam ellipse that is lower than or equal to 3-step, such that chromaticity coordinates of light emitted from different light-emitting diodes of the backlight source may be located within the MacAdam ellipse that is lower than or equal 3-step. A human eye cannot distinguish light of two different chromaticity coordinates located within a same 3-step MacAdam ellipse. Thus, even if different LEDs in the backlight source emit light of different luminances and chrominances, the human eye cannot tell the difference. Accordingly, when the display device displays images, light emitted from different regions of the display device may have luminances and chrominances that appear the same to the human eye, and a display performance of the display device may be improved.

Figure 9A:
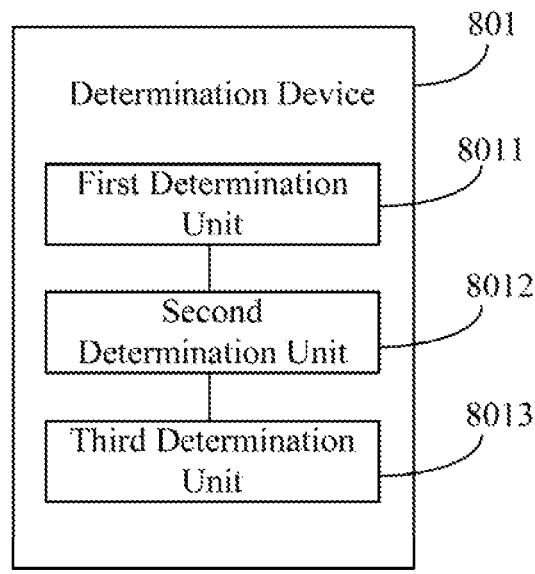
FIGS. 9A and 9B illustrate block diagrams of an exemplary determination device according to various disclosed embodiments of the present disclosure.

FIG. 9A illustrates a block diagram of an exemplary determination device according to various disclosed embodiments of the present disclosure. As shown in FIG. 9A, the determination device 801 includes a first determining unit 8011, a second determining unit 8012, and a third determination unit 8013.

The first determination unit 8011 is configured to determine a target color temperature of the display device including the backlight source.

The second determination unit 8012 is configured to determine an intersection of an isothermal line segment of the target color temperature and a Planckian locus on a uniform chromaticity diagram.

The third determination unit 8013 is configured to determine an n-step MacAdam ellipse according to the isothermal line segment and the intersection, where the intersection is located within the n-step MacAdam ellipse, and two endpoints of the isothermal line segment are located on the n-step MacAdam ellipse.

In some embodiments, the third determination unit 8013 may further be configured to determine at least one initial ellipse according to the isothermal line segment and the intersection. The initial ellipse has a center point at the intersection, and the two endpoints of the isothermal line segments are located on the at least one initial ellipse. The third determination unit 8013 may further be configured to match the at least one initial ellipse with an m-step MacAdam ellipse (n≤m≤7) in the uniform chromaticity diagram to determine a largest initial ellipse that contains the m-step MacAdam ellipse from the at least one initial ellipse, and to determine a chromaticity-region quadrilateral according to the largest initial ellipse. The chromaticity-region quadrilateral has four vertices, two of which are the two endpoints of the isothermal line segment, and the other two of which are a point on the largest initial ellipse corresponding to a minimum abscissa of the largest initial ellipse in the uniform chromaticity diagram and a point on the largest initial ellipse corresponding to a maximum abscissa of the largest initial ellipse in the uniform chromaticity diagram, respectively. The third determination unit 8013 may be further configured to determine an n-step MacAdam ellipse in the chromaticity-region quadrilateral.

In some embodiments, the plurality of light-emitting diodes may include at least two light-emitting diodes that emits white light of different wavelengths, and further the at least two light-emitting diodes may have different red light components, different green light components, and different blue light components in the emitted white light.

In some embodiments, each two neighboring light-emitting diodes in the at least two light-emitting diodes may emit white light of different wavelengths.

In some embodiments, among a plurality of chromaticity coordinates of white light emitted from the plurality of light-emitting diodes in the uniform chromaticity diagram, the number of chromaticity coordinates located on one side of the Planckian locus near to the lateral axis of the uniform chromaticity diagram may be larger than the number of chromaticity coordinates located on another side of the Planckian locus farther away from the lateral axis of the uniform chromaticity diagram.

In the fabrication apparatus of the present disclosure for fabricating a backlight source, a fabrication device may fabricate the backlight source according to chromaticity coordinates within an MacAdam ellipse that is lower than or equal to 3-step, such that chromaticity coordinates of light emitted from different light-emitting diode of the backlight source are located within the MacAdam ellipse that is lower than or equal to 3-step. A human eye cannot distinguish light of two different chromaticity coordinates located in a same 3-step MacAdam ellipse. Thus, even if different LEDs in the backlight source emit light of different luminances and chrominances, the human eye cannot see the difference. Accordingly, when a display device including the backlight source displays an image, light emitted from different regions of the display device may have luminances and chrominances that appear the same to the human eye, and a display performance of the display device may be improved.

Figure 9B:
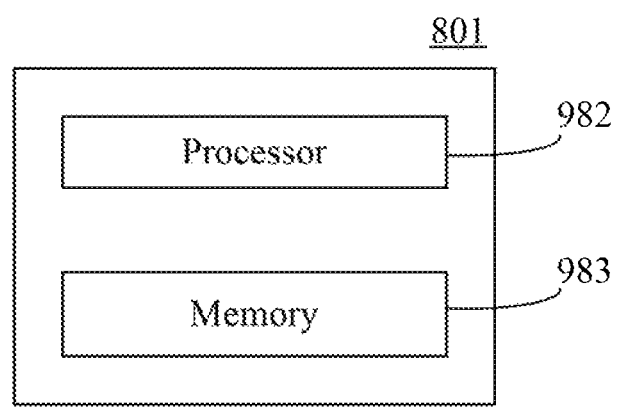

FIG. 9B illustrates a block diagram of another exemplary hardware configuration of the exemplary determination device 801 according to various disclosed embodiments of the present disclosure. As shown in FIG. 9B1, the determination device 801 includes a processor 982 and a memory 983. The memory 983 stores instructions for execution by the processor 982 to perform a method consistent with the present disclosure. In some embodiments, the processor 982 may include, for example, a microprocessor. In some embodiments, the memory 983 may include, for example, a read only memory (ROM) or a random access memory (RAM).

Figures 10A, 10B:
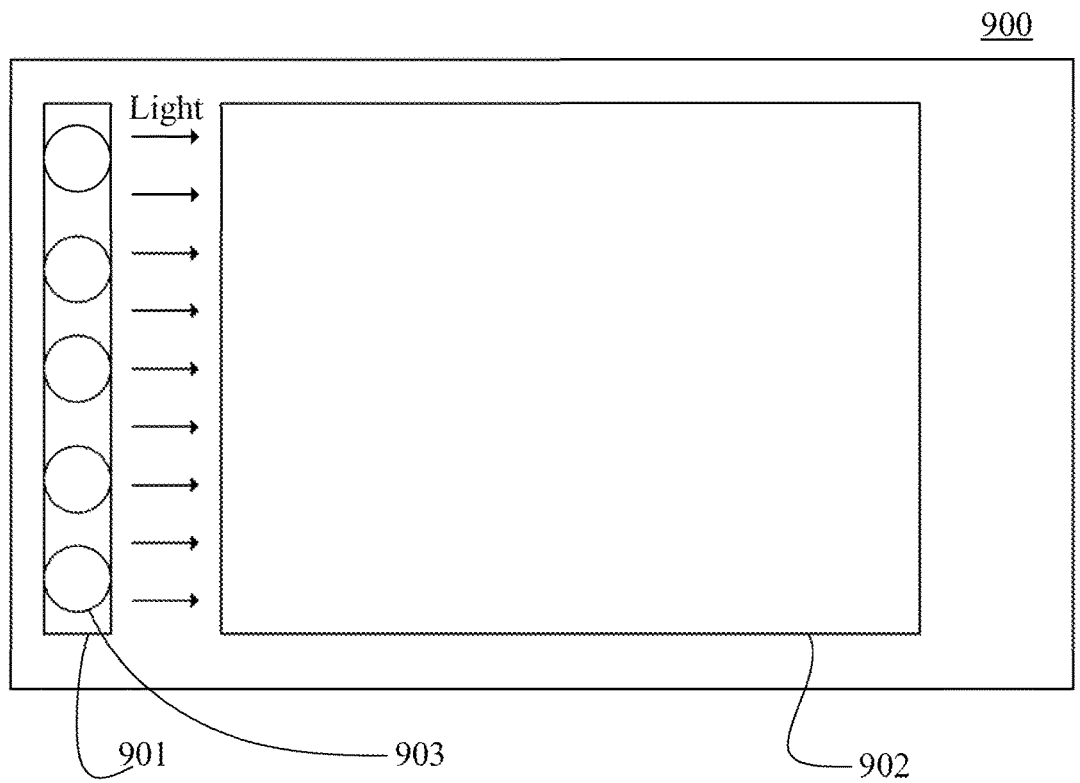
FIG. 10A illustrates a schematic view of an exemplary display device according to various disclosed embodiments of the present disclosure.
FIG. 10B illustrates a schematic view of an exemplary display system according to various disclosed embodiments of the present disclosure.

The present disclosure provides a display device. FIG. 10A illustrates a schematic view of an exemplary display device 900 according to various disclosed embodiments of the present disclosure. As shown in FIG. 10A, the display device 900 includes a backlight source 901 and a display panel 902. The backlight source 901 includes a plurality of LEDs 903, and provides light to the display panel 902. The backlight source 901 can be fabricated, for example, by a fabrication method consistent with the present disclosure, such as the fabrication method described above in connection with FIG. 1 or FIG. 2. The backlight source can be arranged on, for example, a light entry side of the display panel. FIG. 10A shows an edge-lit display device as an example, in which the backlight source is arranged at an edge of the display panel. A display device consistent with embodiments of the disclosure can include a backlit display device, in which the backlight source is arranged at the back of the display panel.

The display device can be, for example, a liquid crystal display device, an electronic paper, a mobile phone, a tablet computer, a television set, a monitor, a notebook computer, a digital photo frame, a navigator, or any product or component having a display function.

In the display device of the present disclosure, chromaticity coordinates of light emitted from different light-emitting diodes of the backlight source may be located within a same MacAdam ellipse that is lower than or equal to 3-step. A human eye cannot distinguish light of two different chromaticity coordinates located in a same 3-step MacAdam ellipse. Thus, even if different LEDs in the backlight source emit light of different luminances and chrominances, the human eye cannot tell the difference. Accordingly, when the display device displays an image, light emitted from different regions of the display device may have luminances and chrominances that appear the same to the human eye, and a display performance of the display device may be improved.

The present disclosure provides a display system. The display system can include a plurality of display devices consistent with the present disclosure that are assembled together. Each of the plurality of display devices can include a backlight source and a display panel, and the backlight source can be fabricated, for example, by a fabrication method consistent with the present disclosure, such as the fabrication method described above in connection with FIG. 1 or FIG. 2. The backlight source can be arranged on, for example, a light entry side of the display panel.

FIG. 10B illustrates a schematic view of an exemplary display system X according to various disclosed embodiments of the present disclosure. As shown in FIG. 10B, the display system X includes a plurality of display devices Y, which are arranged in an array and assembled to form the display system X. As such, a display area of the display system X is equal to or close to a sum of display areas of the plurality of display devices Y, and the display system X can have a relatively large display area. The manner of assembling the plurality of display devices shown in FIG. 10B is merely for illustrative purposes, and does not limit the scope of the present disclosure. In the present disclosure, the plurality of display devices can be arranged and assembled in other manners according to various application scenarios, which are not limited.

In the display system of the present disclosure, in a backlight source of each display device, chromaticity coordinates of light emitted from different light-emitting diodes may be located within a same MacAdam ellipse that is lower than or equal to 3-step. A human eye cannot distinguish light of two different chromaticity coordinates located in a same 3-step MacAdam ellipse. Thus, even if different LEDs in the backlight source emit light of different luminances and chrominances, the human eye cannot tell the difference. Accordingly, when the display system displays an image, the light emitted from different regions of the display system may have luminances and chrominances that appear the same to the human eye, and a display performance of the display system may be improved.

The present disclosure provides a fabrication method and a fabrication apparatus for a backlight source, a display device, and a display system. The fabrication method may include determining an n-step MacAdam ellipse in a uniform chromaticity diagram (n is an integer smaller than or equal to 3), and fabricating the backlight source according to chromaticity coordinates in the n-step MacAdam ellipse, such that chromaticity coordinates of light emitted from different light-emitting diodes in the backlight source may be located within the n-step MacAdam ellipse. The present disclosure may improve image display performance.

In the present disclosure, method embodiments and corresponding apparatus embodiments/device embodiments/system embodiments can be referred to each other, which is not limited in the present disclosure. The sequence of the steps of method embodiments of the present disclosure can be adjusted appropriately, and the steps can be added or removed appropriately according to various application scenarios, all of which are within the scope of the present disclosure.

The foregoing description of the embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to persons skilled in this art. The embodiments are chosen and described in order to explain the principles of the technology, with various modifications suitable to the particular use or implementation contemplated. It is intended that the scope of the invention be defined by the claims appended hereto in which all terms are meant in their broadest reasonable sense unless otherwise indicated. Therefore, the term "the disclosure," "the present disclosure," or the like does not necessarily limit the claim scope to a specific embodiment, and the reference to exemplary embodiments of the disclosure does not imply a limitation on the invention, and no such limitation is to be inferred. Moreover, the claims may refer to "first," "second," etc., followed by a noun or element. Such terms should be understood as a nomenclature and should not be construed as giving the limitation on the number of the elements modified by such nomenclature unless specific number has been given. Any advantages and benefits described may or may not apply to all embodiments of the disclosure. It should be appreciated that variations may be made to the embodiments described by persons skilled in the art without departing from the scope of the present disclosure. Moreover, no element or component in the present disclosure is intended to be dedicated to the public regardless of whether the element or component is explicitly recited in the following claims.

What is claimed is:

1. A method for fabricating a backlight source, comprising:
   determining an n-step MacAdam ellipse in a uniform chromaticity diagram, n being an integer smaller than or equal to 3; and
   fabricating the backlight source according to chromaticity coordinates within the n-step MacAdam ellipse to cause chromaticity coordinates of light emitted from different light-emitting diodes of the backlight source to be within the n-step MacAdam ellipse,
   wherein determining the n-step MacAdam ellipse includes:
   determining a target color temperature of a display device including the backlight source;
   determining an intersection of an isothermal line segment of the target color temperature and a Planckian locus in the uniform chromaticity diagram; and
   determining the n-step MacAdam ellipse according to the isothermal line segment and the intersection, the intersection being within the n-step MacAdam ellipse, and two endpoints of the isothermal line segment being on the n-step MacAdam ellipse, and wherein determining the n-step MacAdam ellipse according to the isothermal line segment and the intersection includes:

determining at least one initial ellipse according to the isothermal line segment and the intersection, each of the at least one initial ellipse having the intersection as a center point, and the two endpoints of the isothermal line segment being on each of the at least one initial ellipse;

matching the at least one initial ellipse with an m-step MacAdam ellipse in the uniform chromaticity diagram to determine, from the at least one initial ellipse, a largest initial ellipse containing the m-step MacAdam ellipse, wherein n≤m≤7;

determining a chromaticity-region quadrilateral according to the largest initial ellipse, the two endpoints of the isothermal line segment forming a first vertex and a second vertex of the chromaticity-region quadrilateral, respectively, a point on the largest initial ellipse corresponding to a minimum abscissa of the largest initial ellipse in the uniform chromaticity diagram forming a third vertex of the chromaticity-region quadrilateral, and a point on the largest initial ellipse corresponding to a maximum abscissa of the largest initial ellipse in the uniform chromaticity diagram forming a fourth vertex of the chromaticity-region quadrilateral; and determining the n-step MacAdam ellipse in the chromaticity-region quadrilateral.

2. A display device, comprising a backlight source and a display panel, the backlight source being fabricated by the method according to claim 1.

3. A display system, comprising a plurality of display devices according to claim 2.

4. The method according to claim 1, wherein:
the light-emitting diodes include at least two light-emitting diodes that emit white light of different wavelengths, and
the at least two light-emitting diodes have different red light components, different green light components, and different blue light components in the emitted white light.

5. The method according to claim 4, wherein:
each two neighboring light-emitting diodes of the at least two light-emitting diodes emit white light of different wavelengths.

6. The method according to claim 4, wherein:
among a plurality of chromaticity coordinates of white light emitted from the light-emitting diodes in the uniform chromaticity diagram, a number of chromaticity coordinates located on one side of the Planckian locus near to a lateral axis of the uniform chromaticity diagram is larger than a number of chromaticity coordinates located on another side of the Planckian locus farther away from the lateral axis of the uniform chromaticity diagram.

7. The method according to claim 1, wherein:
n is equal to 3, and
the n-step MacAdam ellipse has a span less than or equal to approximately 0.01 in a lateral-axis direction of the uniform chromaticity diagram, and has a span less than or equal to approximately 0.00978 in a vertical-axis direction of the uniform chromaticity diagram.

* * * * *